United States Patent
Forman et al.

(10) Patent No.: US 10,495,710 B2
(45) Date of Patent: Dec. 3, 2019

(54) TIME-RESOLVED MR IMAGES DURING A CYCLICAL MOVEMENT

(71) Applicants: Christoph Forman, Erlangen (DE); Andreas Greiser, Erlangen (DE)

(72) Inventors: Christoph Forman, Erlangen (DE); Andreas Greiser, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 501 days.

(21) Appl. No.: 15/086,338

(22) Filed: Mar. 31, 2016

(65) Prior Publication Data

US 2016/0306022 A1    Oct. 20, 2016

(30) Foreign Application Priority Data

Apr. 16, 2015  (DE) .................. 10 2015 206 874

(51) Int. Cl.
*G01R 33/567*  (2006.01)
*G01R 33/48*  (2006.01)
(Continued)

(52) U.S. Cl.
CPC ....... *G01R 33/50* (2013.01); *G01R 33/56333* (2013.01); *G01R 33/4835* (2013.01);
(Continued)

(58) Field of Classification Search
CPC ........... G01R 33/5608; G01R 33/4835; G01R 33/5611; G01R 33/543; G01R 33/4828
(Continued)

(56) References Cited

U.S. PATENT DOCUMENTS 4,777,957 A * 10/1988 Wehrli ................ A61B 5/0263
                                                                324/306
5,200,700 A *  4/1993 Glover ............... G01R 33/5673
                                                                324/307
(Continued)

FOREIGN PATENT DOCUMENTS

DE           60128370 T2    1/2008
DE        102012217321 A1   3/2014
(Continued)

OTHER PUBLICATIONS

German office Action for related German Application No. 10 2015 206 874.9 dated Aug. 12, 2016.
(Continued)

*Primary Examiner* — Christopher P McAndrew
(74) *Attorney, Agent, or Firm* — Lempia Summerfield Katz LLC (57) ABSTRACT

The embodiments disclosed herein relate to a method for generating time-resolved images of an examination object, which executes a cyclical movement, and to a magnetic resonance device, and a computer program product herefor. According to a first aspect, at least one spatial magnetization pattern with spatial magnetization differences is generated during a magnetization of the examination object. Furthermore, magnetic resonance signals of the examination object are acquired after generating the spatial magnetization pattern throughout at least one cycle of the cyclical movement. At least one k-space is undersampled here during the acquisition of the magnetic resonance signals. Time-resolved images are generated based on the acquired magnetic resonance signals.

18 Claims, 3 Drawing Sheets

(51) Int. Cl.
*G01R 33/50* (2006.01)
*G01R 33/563* (2006.01)
*G01R 33/483* (2006.01)
*G01R 33/561* (2006.01)

(52) U.S. Cl.
CPC ...... *G01R 33/5611* (2013.01); *G01R 33/5673* (2013.01); *G01R 33/56325* (2013.01)

(58) Field of Classification Search
USPC .......................................................... 324/309
See application file for complete search history.

(56) References Cited

U.S. PATENT DOCUMENTS

| | | | | |
|---|---|---|---|---|
| 5,245,282 | A * | 9/1993 | Mugler, III | G01R 33/4835 |
| | | | | 324/309 |
| 5,275,163 | A * | 1/1994 | McKinnon | G01R 33/5673 |
| | | | | 324/309 |
| 5,281,917 | A * | 1/1994 | Santyr | G01R 33/4828 |
| | | | | 324/307 |
| 6,097,185 | A * | 8/2000 | Watanabe | G01R 33/4835 |
| | | | | 324/307 |
| 6,268,730 | B1 * | 7/2001 | Du | G01R 33/5676 |
| | | | | 324/309 |
| 7,047,060 | B1 | 5/2006 | Wu | |
| 7,254,437 | B2 * | 8/2007 | Miyazaki | A61B 5/055 |
| | | | | 324/307 |
| 7,835,783 | B1 * | 11/2010 | Aletras | G01R 33/56333 |
| | | | | 324/307 |
| 9,354,290 | B2 * | 5/2016 | Greiser | A61B 5/055 |
| 9,547,059 | B2 * | 1/2017 | Greiser | G01R 33/50 |
| 2002/0165446 | A1 | 11/2002 | Ryf et al. | |
| 2007/0078331 | A1 | 4/2007 | Cull et al. | |
| 2007/0253599 | A1 * | 11/2007 | White | G01R 33/56509 |
| | | | | 382/107 |
| 2008/0269595 | A1 * | 10/2008 | Wong | A61B 5/055 |
| | | | | 600/411 |
| 2009/0143666 | A1 * | 6/2009 | Edelman | A61B 5/055 |
| | | | | 600/410 |
| 2009/0281415 | A1 * | 11/2009 | Cupps | A61B 5/055 |
| | | | | 600/410 |
| 2010/0239142 | A1 * | 9/2010 | Dannels | G01R 33/246 |
| | | | | 382/131 |
| 2010/0278405 | A1 * | 11/2010 | Kakadiaris | G16H 50/30 |
| | | | | 382/131 |
| 2010/0290682 | A1 * | 11/2010 | Itagaki | G01R 33/561 |
| | | | | 382/131 |
| 2012/0189183 | A1 * | 7/2012 | Xue | G06T 5/50 |
| | | | | 382/131 |
| 2012/0293171 | A1 * | 11/2012 | Dannels | G01R 33/56333 |
| | | | | 324/309 |
| 2013/0278259 | A1 * | 10/2013 | Greiser | G01R 33/50 |
| | | | | 324/309 |
| 2013/0310678 | A1 * | 11/2013 | Balbi | A61B 5/055 |
| | | | | 600/410 |
| 2014/0018666 | A1 | 1/2014 | Koktzoglou et al. | |
| 2014/0126796 | A1 * | 5/2014 | Chesneau | G01R 33/4824 |
| | | | | 382/131 |
| 2014/0303482 | A1 * | 10/2014 | Santini | A61B 5/055 |
| | | | | 600/411 |
| 2016/0157747 | A1 | 6/2016 | Greiser | |

FOREIGN PATENT DOCUMENTS

DE 102014225282 A1 6/2016
WO WO2014162300 A1 10/2014

OTHER PUBLICATIONS

Mc Veigh Elliot R.: "MRI of Myocardial Function: Motion Tracking Techniques"; 0730-72SX(95)02009-1; Magnetic Resonance Imaging; vol. 14 No. 2; Elsevier Science Inc.; pp. 137-150, 1996.

* cited by examiner

TIME-RESOLVED MR IMAGES DURING A CYCLICAL MOVEMENT

This application claims the benefit of DE 10 2015 206 874.9, filed on Apr. 16, 2015, which is hereby incorporated by reference in its entirety.

TECHNICAL FIELD

The embodiments relate to a method for generating time-resolved images of an examination object, which executes a cyclical movement, and to a magnetic resonance device, and to a computer program product.

BACKGROUND

Magnetic resonance tomography (MRT) or magnetic resonance imaging (MRI) is an imaging method used in medical diagnostics for representing the structure and function of tissues and/or organs in an examination object, e.g., a body of a human or animal patient. To this end, rapidly switching gradient fields generated by a gradient system of the magnetic resonance device may overlay a static basic magnetic field in a magnetic resonance device. Furthermore, a radio frequency antenna unit of the magnetic resonance device serves to radiate RF pulses into the examination object in order to trigger magnetic resonance signals and to receive the triggered magnetic resonance signals. Magnetic resonance images, or in brief images, are produced on this basis.

MRT in particular allows for the generation of time-resolved images of cyclical movements, such as are performed for instance by a heart of a patient. For this purpose, spatial magnetization patterns, (also referred to as tagging patterns), may be impressed onto the examination object with selective RF pulses, (also referred to as tagging pulses or magnetization pulses). With such methods, (also known as tagging methods), the examination object appears with a line or grid pattern in the MR image.

The tagging method was previously implemented in segmented CINE measurements, in order to obtain local movement information, e.g., of a heart. In this way, a number of magnetic resonance images per heart cycle are recorded thereby producing a type of film of the heart movement. With a segmented measurement, the data recording for an MR image is divided into several movement cycles and the magnetic resonance data is only recorded in comparable movement phases.

Moreover, account is taken of the breathing and heart movement during the heart imaging, wherein the movement may be minimized using a breath-hold technique. Due to requirements in terms of spatial and temporal resolution, often only one cycle period, (e.g., only one heartbeat), could previously be triggered, particularly within a typical breath-hold time.

SUMMARY AND DESCRIPTION

The scope of the present invention is defined solely by the appended claims and is not affected to any degree by the statements within this summary. The present embodiments may obviate one or more of the drawbacks or limitations in the related art.

The object of the present embodiments is to provide a method, which allows for an improved generation of time-resolved images of an examination object, which executes a cyclical movement. In particular, it should be possible to obtain a higher information content in a short time.

According to a first aspect, a method for generating time-resolved images of an examination object, which executes a cyclical movement, with the aid of a magnetic resonance device, includes generating at least one spatial magnetization pattern with spatial magnetization differences during a magnetization of the examination object. Furthermore, magnetic resonance signals of the examination object are acquired after generating the spatial magnetization pattern during at least one cycle of the cyclical movement. Here, at least one k-space is undersampled during the acquisition of the magnetic resonance signals. Time-resolved images are generated on the basis of the acquired magnetic resonance signals.

The cyclical movement may refer to a repetitive, periodic movement, which is executed substantially identically during each period. The cycle of the cyclical movement refers, in particular, to a repetitive section of the cyclical movement. A heartbeat may refer to a cycle of the heart activity for instance, wherein a time interval between two heartbeats may refer to the cycle length. Heartbeats may also be shown and/or characterized by an electrocardiogram (EKG), which, per cycle, may include inter alia different waves, such as Q-waves, R-waves and/or S-waves. The time interval between two R-waves, which may also be referred to as RR interval, may also be understood to be the cycle length. A maximum of one spatial magnetization pattern may be generated per cycle.

The spatial magnetization pattern may also be referred to as a tagging pattern and may be produced by selective RF pulses, (also referred to as tagging pulses or magnetization pulses). Grid tagging, (in other words, a network of saturation lines), and strip tagging, (in other words, parallel strips in the resulting MRT image), may inter alia be used as possible variants.

The time-resolved images advantageously map a cyclical motion sequence. To this end, a cycle period, within which a cycle of the cyclical movement takes place, is subdivided for instance by a specific time scale of, e.g., 50 milliseconds into a number of cycle phases, (such as heart phases), and magnetic resonance signals are recorded within each of these cycle phases, on the basis of which at least one image is generated for each cycle phase. A film-type display of the cyclical motion sequence may take place by displaying these images consecutively.

It is possible, in particular, for the images to have been recorded using a segmented recording technique, in which the k-space of an image is subdivided into different segments. Here, a segment may be captured in one cycle, e.g., in a period of the cyclical movement, so that all segments of the k-space of an image are finally captured throughout a number of cycles. A k-space for an image, which is to represent the state of a heart in the diastole, may be subdivided into three segments for instance, wherein the first of these three segments is filled with the aid of magnetic resonance signals acquired during a first heart cycle, and the second of these three segments is filled with the aid of magnetic resonance signals acquired during a second heart cycle, and the third of these three segments is filled with the aid of magnetic resonance signals acquired during a third heart cycle.

During the capture of the at least one k-space, also referred to as local frequency space, the at least one k-space is advantageously undersampled, e.g., a sparsely populated k-space matrix is obtained. The acquisition of magnetic resonance signals may take place more quickly as a result, since all entries of the at least one k-space matrix are no longer captured, as usual, but instead only a part thereof. An acceleration factor n, e.g., only the n-th part is still needed to capture magnetic resonance signals, may be produced with an undersampling factor n, e.g., only the average of each n-th matrix element is scanned. The undersampling factor used in this method advantageously amounts to at least two, at least three, or at least four. Parallel acquisition techniques (PAT) may also be used during the acquisition of magnetic resonance signals.

Compared with conventional capturing methods with a measurement time that remains the same, this acceleration allows the spatial and temporal resolution of a CINE measurement to be increased. Furthermore, additional information may be collected by shortening the measurement, wherein the measurement may however still be completed in a short breath-hold time. In a further aspect, it is therefore proposed for the acquisition of the magnetic resonance signals of the examination object to take place within a single breath-hold time of the examination object. Breath-hold time, which may also be referred to as breath-hold phase, may refer to the period of time in which the patient holds his/her breath. The maximum breath-hold time is naturally limited to the specific patient. By shortening the measurement performance, the operational efficiency of the examination and the patient comfort may be increased. Moreover, a comparison and/or a merging of images and/or magnetic resonance signals originating from a number of breath-hold times is barely possible and/or associated with considerable losses in terms of quality.

The method may be performed successively a number of times, e.g., successively within a number of different breath-hold times.

One embodiment provides for the undersampling of the k-space to take place in a pseudo-random manner.

A conventional regular scanning of the k-space may take place on the basis of a pulse sequence, which has a number of sections, wherein only a few parameters or only one parameter such as a phase-encoding gradient, may be varied slightly from section to section. A regular scanning pattern including scanning points, for instance, which have an equidistant spacing may be produced from the regular scanning of the k-space. Such a regular scanning may be suited to the use of linear transformations for image generation.

By contrast, a pseudo-random scanning, which may also be referred to as pseudo-randomized and/or irregular, takes place on the basis of a pulse sequence, wherein at least one parameter is significantly and/or irregularly varied during the course of the excitation sequence. An irregular scanning pattern, which may have no recognizable structure, is produced herefrom. Such a pseudo-randomized scanning may be suited to use in iterative reconstruction methods for image generation.

It is therefore further proposed that the generation of time-resolved images takes place by iterative reconstruction. Iterative reconstruction methods may enable the processing of significantly undersampled k-spaces, e.g., data may be reconstructed, the recording of which only requires very little measurement time. Moreover, the use of an iterative reconstruction may again compensate for any loss of signal-to-noise ratio (SNR) and the tagging-based movement information may be evaluated just as effectively as in any unaccelerated measurement. Iterative reconstruction models may be based on an L1-standardized wavelet approach for instance.

As already described, it is also proposed that the examination object is a myocardal muscle, also referred to as myocardium, and/or the cyclical movement is a heartbeat. The proposed method may be used particularly advantageously precisely here. A triggering of the acquisition of magnetic resonance signals is possible here in particular with the aid of known EKG devices.

Each of the spatial magnetization patterns is generated at a tagging time instant within a cycle, wherein at least two of the tagging time instants may differ in respect of their position within their cycle. Here, the tagging time instant is the time interval between a reference time instant that remains the same from cycle to cycle, (for instance, the start of the cycle), and a time instant of generating the at least one spatial magnetization pattern within the respective cycle.

In other words, at least two spatial magnetization patterns may be generated in different cycle phases, e.g., the generation of the at least two spatial magnetization patterns takes place in a phase-shifted manner. The start of the cycles may be defined for instance in heart cycles by the respective R-waves of a signal profile of an electrocardiogram. Here, only one spatial magnetization pattern may be generated per cycle.

In conventional methods, due to requirements for spatial and temporal resolution, a spatial magnetization pattern is only repeatedly generated in one phase within the cycles, e.g., in a first cycle the spatial magnetization pattern is generated at the same tagging time instant as in the cycles that follow. The spatial magnetization pattern fades more and more during the course of the cycle, however, before the spatial magnetization pattern potentially refreshes again in a subsequent cycle by generating a further spatial magnetization pattern.

Without prolonging the overall measurement time that may be limited by the breath-hold time, acceleration of the measurement according to the method allows the spatial magnetization pattern to be applied successively one after the other at different tagging time instants, e.g., at different cycle phases, in particular myocardial phases. This advantageously results in an improved contrast of the magnetization pattern in cycle phases that have relatively long time intervals from the otherwise only one tagging time instant. This is of particular interest in a heart examination when analyzing the diastolic heart function.

According to one aspect, the at least two tagging time instants differ in respect of their position within their cycle by at least a quarter, at least a third, or at least half of a cycle length, e.g., the different cycle phases, in which the at least two spatial magnetization patterns are generated, are spaced apart by at least a quarter, at least a third, or at least half of a cycle length. In other words, a time interval between the reference time instant of a cycle and the time instant for generating the at least one spatial magnetization pattern, in other words the tagging time instant, may differ in at least two cycles, in which magnetic resonance signals are acquired, by at least a quarter, at least a third, or at least half of a cycle length.

The tagging time instants used may be distributed at equal time intervals during the cycle length, e.g., with for instance three tagging time instants, the tagging time instants may be spaced apart by in each case a third of the cycle length.

As a result, it may be achieved that images with a high contrast-to-noise ratio (CNR) from magnetization pattern to tissue structures may be generated across a wide range of cycle phases.

One embodiment provides that the generation of two successive magnetization patterns is spaced apart temporally by at least two cycle lengths.

In particular, no further magnetization pattern is thus generated after generating a spatial magnetization pattern within the following cycle. This is advantageous in that the fading of the magnetization pattern may be observed and/or measured during a longer time duration, from which further information, such as a Ti time, may be derived for instance. The fading of the magnetization pattern may in particular be understood to mean that a signal intensity of tagging lines is lower and/or is equal to a signal intensity of a tissue surrounding the tagging lines.

A T1 time may be determined in a further act on the basis of the acquired magnetic resonance signals. T1 time may refer to a tissue-specific time constant, which describes a return to a longitudinal magnetization in an equilibrium state. The T1 time may inter alia also be referred to as T1 constant and/or longitudinal relaxation time.

In particular, a global T1 time in a myocardal muscle tissue may be based on the time profile of the fading of the magnetization pattern. Since the native T1 time in the myocardal muscle tissue may lie in the range of and/or above the duration of a heartbeat, a precise evaluation of the T1 time may still not take place on the basis of an individual heartbeat, whereas from the change in the magnetization pattern this is precisely possible across a number of heartbeats.

The T1 time may be determined by modeling, in other words a curve adjustment, of a T1 saturation repetition model function. This allows for a particularly precise estimation of the T1 time.

One embodiment provides that time-resolved images of a number of layers of the examination object are generated. A layer may refer to a thin, three-dimensional square, which is defined by the layer position, field of view (FoV) and/or layer thickness. The central plane of the layer may produce the image plane.

The acceleration of the measurement data recording allows a number of layers of the examination object to be captured within a single breath-hold time instead of just one layer, for example. A combination of this aspect with further already described aspects is also conceivable, such as, for instance, the capture of a number of layers during in each case a number of cycles, (e.g., heartbeats).

A magnetic resonance device is described below. Its advantages correspond substantially to the advantages of the method for generating time-resolved images of an examination object, which executes a cyclical movement, which are cited in detail above. Features, advantages or alternative embodiments mentioned herein may also be applied to the other claimed subject matter and vice versa. In other words, the present claims may also be further developed with the features described or claimed in conjunction with a method. The corresponding functional features of the method are embodied here by suitable representational units, e.g., by hardware units.

The magnetic resonance device is embodied to perform a method as described herein. The magnetic resonance device includes a radio frequency antenna unit embodied to acquire magnetic resonance signals, and a system control unit embodied to perform a pulse sequence with an undersampling of a k-space in order to acquire magnetic resonance signals and to generate time-resolved images on the basis of the acquired magnetic resonance signals.

A computer program product is also proposed, which includes a program and may be directly loaded into a memory of a programmable system control unit of a magnetic resonance device and program resources, e.g., libraries and auxiliary functions, in order to execute a method, if the computer program product is executed in the system control unit of the magnetic resonance device.

Here, the computer program product may be a software with a source code, which is compiled and linked or which only has to be interpreted, or an executable software code, which for execution purposes only still has to be loaded into the system control unit. By the computer program product, the method may be repeated quickly and identically and embodied in a robust manner. The computer program product is configured such that it may execute the method acts by the system control unit. Here, the system control unit has the preconditions such as for instance a corresponding work memory, a corresponding graphics card or a corresponding logics unit, so that the respective method acts may be executed efficiently. The computer program product is saved on a computer-readable medium for instance, or stored on a network or server, from where it may be loaded into the processor of a local system control unit, which may be directly connected to the magnetic resonance device or be embodied as part of the magnetic resonance device. Furthermore, control information from the computer program product may be stored on an electronically readable data carrier. The control information of the electronically readable data carrier may be embodied such that it performs a method with the use of the data carrier in a system control unit of a magnetic resonance device. Examples of electronically readable data carriers are a DVD, a magnetic tape or a USB stick, on which electronically readable control information, in particular software, is stored. If this control information is read from the data carrier and stored in a system control unit of the magnetic resonance device, all embodiments of the above-described method may be performed. The embodiments may also be based on the computer readable medium and/or the electronically readable data carrier.

BRIEF DESCRIPTION OF THE DRAWINGS

Further advantages, features and details will become apparent from the exemplary embodiments described below as well as with reference to the drawings. Parts corresponding to one another are provided with the same reference numerals in all the figures.

DETAILED DESCRIPTION

Figure 8:
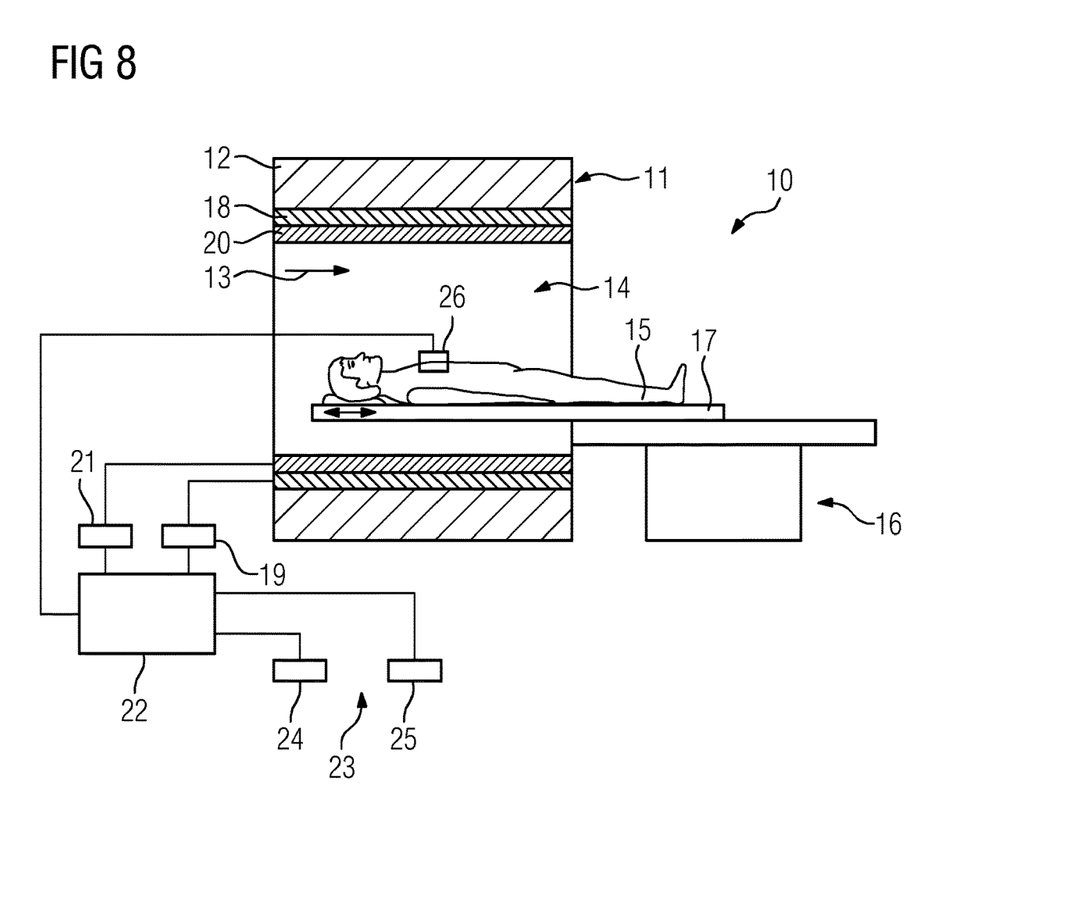
FIG. 8 depicts a schematic representation of an example of a magnetic resonance device.

A magnetic resonance device 10 is depicted by way of example schematically in FIG. 8, which is embodied to execute a method for generating time-resolved images of an examination object, which executes a cyclical movement. The magnetic resonance device 10 includes a magnet unit 11 having a superconducting main magnet 12 for generating a powerful and in particular temporally constant main magnetic field 13. In addition, the magnetic resonance device 10 has a patient-receiving zone 14 for receiving an examination object 15, here a patient, the myocardal muscle of which executes a cyclical movement. Electrical activity of the myocardal muscle is captured with the aid of an EKG device 26, which is connected to a system control unit 22.

In the present exemplary embodiment the patient-receiving zone 14 is embodied to be cylindrical and is surrounded cylindrically in a peripheral direction by the magnet unit 11. An embodiment of the patient receiving zone 14 that deviates therefrom is however conceivable at any time. The patient 15 may be introduced into the patient-receiving zone 14 by a patient support apparatus 16 of the magnetic resonance apparatus 10. The patient positioning device 16 to this end has a couch 17 configured to be movable within the patient receiving zone 14.

The magnet unit 11 also has a gradient coil unit 18 for generating magnetic field gradients that are used for spatial encoding during imaging. The gradient coil unit 18 is controlled by a gradient control unit 19 of the magnetic resonance device 10 and includes a number of gradient coils, which are activated by coil channels. The magnet unit 11 further includes a radio frequency antenna unit 20, which, in the present exemplary embodiment, is embodied as a body coil fixedly integrated into the magnetic resonance device 10. The radio frequency antenna unit 20 is designed to excite atomic nuclei that become established in the main magnetic field 13 generated by the main magnet 12. The radio frequency antenna unit 20 is controlled by a radio frequency antenna control unit 21 of the magnetic resonance device 10 and radiates radio frequency pulses, in particular tagging pulses, into an examination space that is substantially formed by a patient-receiving zone 14 of the magnetic resonance device 10. The radio frequency antenna unit 20 is further embodied to acquire magnetic resonance signals.

In order to control the main magnet 12, the gradient control unit 19 and in order to control the radio frequency antenna control unit 21, the magnetic resonance device 10 has the system control unit 22 including one or a number of processors. The system control unit 22 controls the magnetic resonance device 10 centrally, such as the performance of a predetermined imaging pulse sequence, which is embodied in particular to perform an undersampling of a k-space in order to acquire magnetic resonance signals. Moreover, the system control unit 22 includes a storage unit and an evaluation unit for evaluating medical image data, in particular for generating time-resolved images on the basis of the acquired magnetic resonance signals. Furthermore, the magnetic resonance device 10 includes a user interface 23, which is connected to the system control unit 22. Control information such as imaging parameters, for example, as well as reconstructed magnetic resonance images may be displayed on a display unit 24, for example on at least one monitor, of the user interface 23 for a medical operator. Furthermore, the user interface 23 has an input unit 25 by which information and/or parameters may be input by the medical operator during a measurement procedure.

The magnetic resonance device 10 depicted in the present exemplary embodiment may include further components that magnetic resonance devices typically have. A method of functioning of a magnetic resonance device 10 is also known to a person skilled in the art, so that a more detailed description of the components is not included. The magnetic resonance device 10 is designed together with the system control unit 22 to execute a method for generating time-resolved images of an examination object, which implements a cyclical movement, which is depicted schematically in FIG. 6 and/or FIG. 7.

Furthermore, the system control unit 22 includes a corresponding software and/or computer programs, which may be loaded into a memory of the system control unit 22, having a program in order to execute the method for generating time-resolved images of an examination object, which executes a cyclical movement, if the program is executed in the system control unit 22 of the magnetic resonance device 10.

Figure 1:
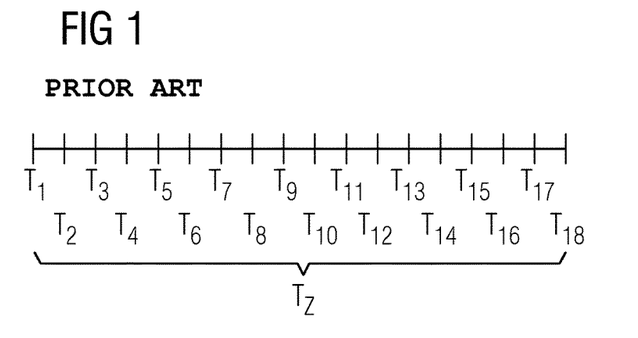
FIG. 1 depicts a schematic representation of a cycle according to the prior art.

A cycle with the cycle length $T_z$ is depicted schematically in FIG. 1. One possible motion cycle of a patient may be a heartbeat, which may also be referred to as heart cycle. A heartbeat may be described on the basis of an electrocardiogram (EKG), also referred to as heart voltage curve, which may have characteristic R-waves. A heart cycle may be limited by two R-waves. The distance between two R-waves may be the cycle length of the heart movement.

The cycle may be subdivided into a number of cycle phases, to which each may be assigned a time instant, in this case T1 to T18. These time instants, such as are arranged equidistantly in this example, e.g., the time interval between two consecutive cycle phases may be selected to be the same. In order to generate time-resolved images, in particular, a (dynamic) CINE image, a (static) image may be generated at each of these time instants. A CINE image may refer to a short film, which depicts a cyclical movement, for instance a heartbeat. This may be generated by a juxtaposition of the (e.g., static) images.

With the requirements in terms of spatial and temporal resolution, it is however normally not possible to generate a useable CINE image within just one heartbeat. If one assumes, for instance, an image resolution of 192×150 pixels and a time resolution of 18 images per heartbeat, 18×192×150 k-space values are produced, which have to be captured within a heartbeat of approximately one second duration. This may not be performed with previously conventional systems however.

Figure 2:
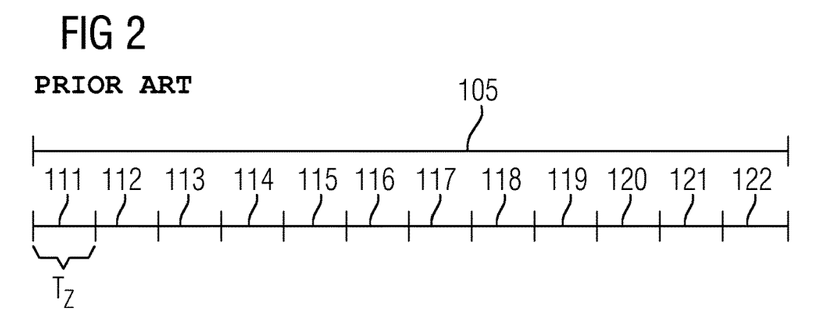
FIG. 2 depicts a schematic representation of a breath-hold phase according to the prior art.

The magnetic resonance signals required to scan the 18 k-space matrices during a number of heartbeats are therefore captured within one breath-hold time 105 as illustrated in FIG. 2. One part of the magnetic resonance signals is acquired in the heart cycle 111, a further part in the heart cycle 112, etc. Here, a magnetization pulse may be irradiated into the examination object 15 before each signal acquisition at a tagging time instant, (e.g., at the start of each cycle), whereby a magnetization pattern, also referred to as tagging pattern, is impressed onto the images to be generated. The length of the breath-hold time 105 is limited by the ability of the patient to hold his breath during a longer period. Reasonable breath-hold times 105 have a duration of 10 to 20 seconds. With an exemplary length of the breath-hold time 105 of 12 seconds with an assumed heart frequency of 60 heartbeats per minute, twelve heart cycles result 111, 112, 113, 114, 115, 116, 117, 118, 119, 120, 121 and 122, which are included in the breath-hold time 105. Conventionally, just as many magnetic resonance signals may be acquired within a breath-hold time 105 as are required for a CINE image of a layer of a resolution.

Figure 6:
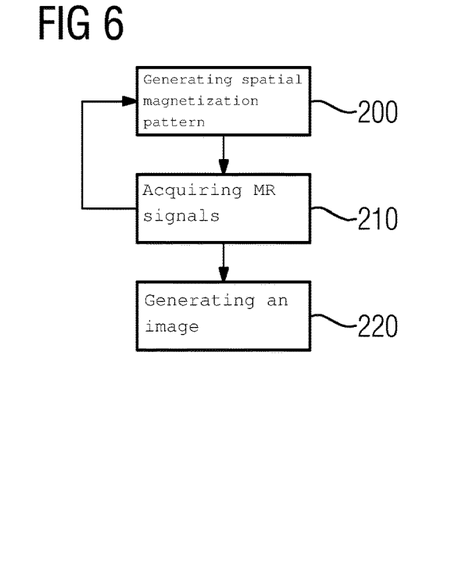
FIG. 6 depicts a schematic block diagram of an example of a method.

This restriction may be overcome by the method depicted in FIG. 6 for generating time-resolved images of an examination object 15, which executes a cyclical movement. In act 200, at least one spatial magnetization pattern with spatial magnetization differences is generated during a magnetization of the examination object 15. The at least one spatial magnetization pattern may be generated by corresponding magnetization pulses, also referred to as tagging pulses, being irradiated into the patient 15 by the radio frequency antenna unit 20.

An acquisition of magnetic resonance signals of the examination object 15 follows in act 210 in order to record magnetic resonance images of the examination object 15 during at least one cycle of the cyclical movement after generating the spatial magnetization pattern by the radio frequency antenna unit 20, which may also include possible local coils. Magnetization pulses may therefore be preparation pulses, which are applied before the actual image-capturing pulse sequence. During the acquisition of the magnetic resonance signals, a k-space is undersampled, as a result of which the required acquisition duration may be reduced compared with a conventional full scan of the k-space.

A k-space may be considered to be a multi-dimensional matrix, which is scanned during the measurement, e.g., filled with measured values. At least one image may be generated in act 220 by the system control unit 22 on the basis of a k-space scanned wholly or, as here, only partially.

If a number of k-spaces are scanned during the acquisition in act 210, in particular in a time-resolved manner, a number of time-resolved images may be generated. It may however also be conceivable that a number of k-spaces may be combined to form a single time-resolved k-space with an additional time dimension.

Acts 200 and 210, in other words the generation of the at least one spatial magnetization pattern and the acquisition of the magnetic resonance signals, may be performed repeatedly. It is conceivable for instance that at the start of the cycle 111, a first spatial magnetization pattern is generated and first magnetic resonance signals are then captured, thereupon at the start of the cycle 112, a second spatial magnetization pattern is generated, and second magnetic resonance signals are then captured, etc.

The undersampling of the k-space advantageously takes place in a pseudo-random manner here, e.g., the scanning pattern developing as a result of the undersampling has no regular structure. An irregular scanning pattern is particularly favorable for a generation of the time-resolved images by iterative reconstruction. Although they are only calculated on the basis of a relatively small database, iterative reconstruction methods may generate high quality images, which are comparably just as meaningful as images of conventional methods, which are based on linear transformations for instance. Iterative reconstruction methods that may execute numerical optimization procedures are known in various variants, for instance, based on wavelet transformations.

In particular, the acquisition of the magnetic resonance signals in act 210 may take place within a single breath-hold time 105 of the examination object 15. Within this single breath-hold time 105, the examination object 15 does not execute any or only executes very minimal movements, (in particular breathing movements), thereby achieving resulting images with a high quality.

Time that may be used advantageously in other ways is gained by accelerating the measured data capture due to the k-space undersampling. For instance, the pixel resolution of the images to be generated may be increased, by somewhat larger k-space matrices being selected, and/or the temporal resolution of the CINE image may be increased, e.g., more images are generated per cycle length.

Figure 3:
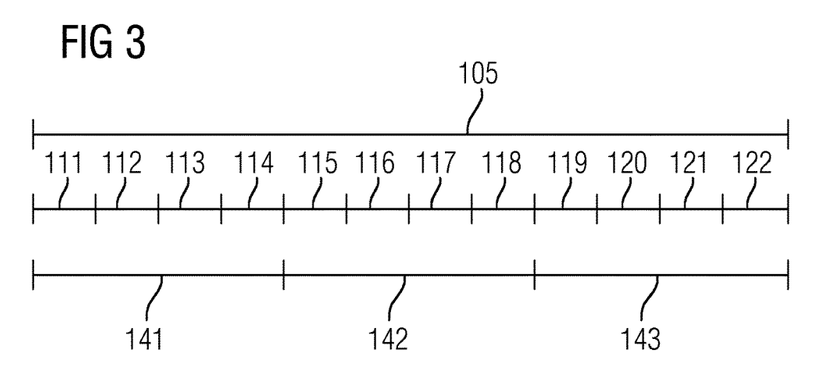
FIG. 3 depicts a schematic representation of a breath-hold phase with three partial sections with different layer capture and/or different tagging time instants, according to an example.

The examination of a number of layers within a breath-hold time 105 is furthermore also conceivable, such as may be illustrated on the basis of FIG. 3. The breath-hold time 105 here includes twelve cycles again. Here, a subsection 141 includes the cycles 111, 112, 113, and 114, a subsection 142 the cycles 115, 116, 117, and 118, and a subsection 143 the cycles 119, 120, 121, and 122. In act 200, for instance, magnetic resonance signals may be captured in each of the subsections 141, 142, and 143, the magnetic resonance signals originating from in each case different layers of the examination object 15, (e.g., in subsection 141), magnetic resonance signals may be captured from a first layer, (e.g., in subsection 142), magnetic resonance signals may be captured from a second layer and in section 142, magnetic resonance signals are captured from a second layer. In other words, a total of three CINE images, which each relate to a different layer, is obtained in this example.

Furthermore, at least two of the tagging time instants may be spaced apart. Conventionally the tagging time instants appear at the same tagging time instant within the cycles. By the proposed application of tagging magnetization at different time instants, a high contrast between tagging structures and surrounding tissue structures may be achieved precisely in the time frames in which the tagging pattern may otherwise already be relatively significantly faded into the corresponding images.

Figure 4:
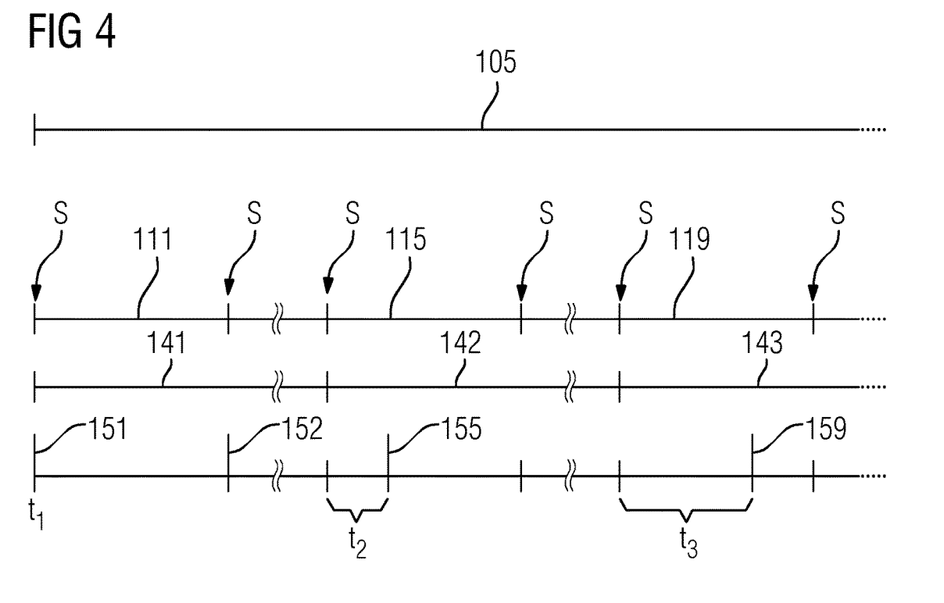
FIG. 4 depicts a schematic representation in detail of a breath-hold phase with three partial sections with different tagging time instants, according to an example.

This should be illustrated by way of example in FIGS. 3 and 4. The breath-hold time 105 includes, as already described, twelve cycles, wherein the subsection 141 includes the cycles 111, 112, 113, and 114, the subsection 142, the cycles 115, 116, 117, and 118, and the subsection 143, the cycles 119, 120, 121, and 122. In subsection 141, magnetization patterns in the associated cycles are now applied in each case at a first tagging time instant t1, in the subsection 142, at a second tagging time instant t2 and in the subsection 143, at a third tagging time instant t3. This is depicted in detail in FIG. 4, wherein the tagging pulses 151, 152, 155, and 159 are also shown, on the basis of which the cited magnetization patterns are generated. The tagging time instants $t_1$, $t_2$ and $t_3$ are specified here relative to the respective start time instants S of the cycles. The tagging pulses corresponding to the cycles 113, 114, 116, 117, 118, 120, 121, and 122 are not shown for the benefit of a clearer display.

Compared with conventional methods, the tagging pattern is therefore not only refreshed once per cycle but instead three times. In the event of a heart examination, an analysis of a subsequent heart function, such as the diastolic heart function, may be improved by tagging pulses being applied successively one after the other in various cycle phases, here cardiac phases. In the example depicted, the tagging time instants t1, t2, and t3 are distributed evenly across the cycle length $T_z$, e.g., $t_1$ is at 0%, $t_2$ is at 33%, and $t_3$ is at 67% of the cycle length. The tagging time instants are therefore spaced apart by a third of the cycle length $T_z$ between two different cycles. Other time intervals are naturally also conceivable however. At least two tagging time instants may be spaced apart by at least one quarter of a cycle length.

A combination of an acquisition of magnetic resonance signals from a number of layers and the use of a number of tagging time instants within a breath-hold time 105 is naturally also possible. A breath-hold time 105 may be divided into four subsections, for instance, wherein in a first subsection at a first tagging time instant a magnetization pattern is impressed and magnetic resonance signals are captured from a first layer, in a second subsection a magnetization pattern is impressed at the first tagging time instant and magnetic resonance signals are captured from a second layer, in a third subsection a magnetization pattern is impressed at a second tagging time instant and magnetic resonance signals are captured from the first layer, and in a fourth subsection a magnetization pattern is impressed at the second tagging time instant and magnetic resonance signals are captured from the second layer.

Figure 5:
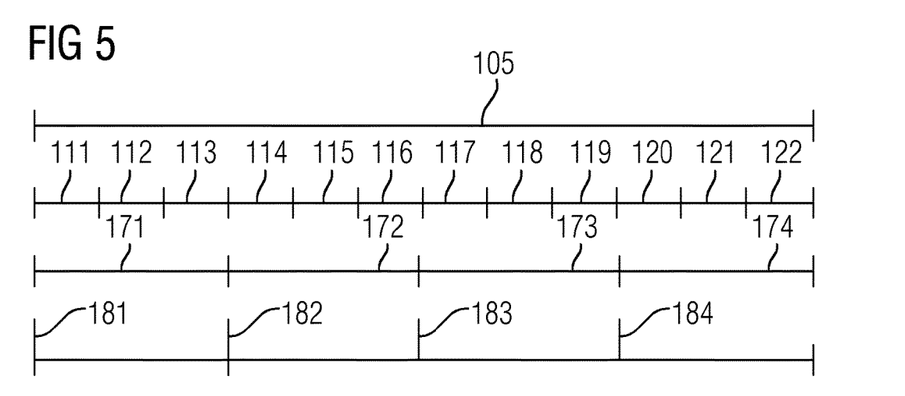
FIG. 5 depicts a schematic representation of a breath-hold phase with four partial sections, which each include three cycles, according to an example.

A further possible variant is depicted in FIG. 5. A tagging pulse is not generated here in each cycle 111, 112, 113, 114, 115, 116, 117, 118, 119, 120, 121, and 122, but instead only once in the subsections 171, 172, 173, and 174 in each case, which include three cycles in each case. The tagging pulses 181, 182, 183, and 184 are generated at the start of the cycle in each case. The generation of two consecutive magnetization patterns is therefore spaced apart temporally by at least two, in this case precisely three, cycle lengths.

Figure 7:
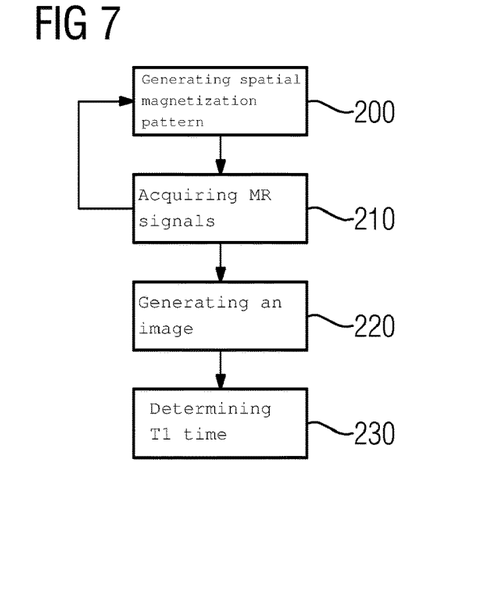
FIG. 7 depicts a schematic block diagram of an additional example of a method.

A T1 time may be advantageously determined in act 230, which is depicted schematically in FIG. 7, on the basis of the acquired magnetic resonance signals. The T1 time in the myocardal muscle tissue may be estimated for instance on the basis of the time profile of the fading of the tagging pattern. A number of heart cycles is advantageous for a precise estimation, since the native T1 time in the myocardal muscle tissue normally lies in the range of or above the duration of a heartbeat. The T1 time may be determined by modeling a Ti saturation repetition model function.

Moreover, in the example depicted in FIG. 5 magnetic resonance signals from different layers of the examination object 15 may be captured from each of the subsections 171, 172, 173, and 174 and images are thus also generated that represent different regions of the examination object 15. In particular, a T1 time may therefore be determined from four different layers in each case.

Finally it should be noted again that the method described in detail above, and the magnetic resonance device shown are only exemplary embodiments that may be modified by the person skilled in the art in a wide variety of ways without departing from the scope. Furthermore, the use of the indefinite article "a" or "an" does not mean that the features in question may not be present more than once. Likewise the term "unit" does not mean that the relevant components may not include a number of interacting sub components, which may in some instances also be spatially distributed.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for generating time-resolved images of an examination object, which executes a cyclical movement, with aid of a magnetic resonance device, the method comprising:
generating at least one tagging pattern with spatial magnetization differences by tagging pulses during a magnetization of the examination object, wherein the at least one tagging pattern comprises two consecutive magnetization patterns, and wherein the two consecutive tagging patterns are spaced apart temporally by at least two cycle lengths;
acquiring magnetic resonance signals of the examination object during at least one cycle of the cyclical movement after the generating of the at least one tagging pattern, wherein at least one k-space is undersampled during the acquiring of the magnetic resonance signals; and
generating time-resolved images based on the acquired magnetic resonance signals.

2. The method of claim 1, wherein the acquiring of the magnetic resonance signals of the examination object is conducted within a single breath-hold time of the examination object.

3. The method of claim 1, wherein the undersampling of the k-space takes place in a pseudo-random manner.

4. The method of claim 1, wherein the time-resolved images are generated by iterative reconstruction.

5. The method of claim 1, wherein the examination object is a myocardal muscle, the cyclical movement is a heartbeat, or the examination object is the myocardal muscle and the cyclical movement is the heartbeat.

6. The method of claim 1, wherein the at least one tagging pattern comprises a plurality of tagging patterns, and
wherein the generating of each tagging pattern of the plurality of tagging patterns is conducted at a tagging time instant within a cycle, wherein at least two of the tagging time instants differ in respect of their position within their cycle.

7. The method of claim 6, wherein the at least two tagging time instants differ by at least one quarter of a cycle length in respect of their position within their cycle.

8. The method of claim 1, further comprising:
determining a T1 time based on the acquired magnetic resonance signals.

9. The method of claim 8, wherein the determining comprises modeling a T1 saturation repetition model function.

10. The method of claim 1, wherein time-resolved images of a plurality of layers of the examination object are generated.

11. The method of claim 2, wherein the undersampling of the k-space takes place in a pseudo-random manner.

12. The method of claim 2, wherein the time-resolved images are generated by iterative reconstruction.

13. The method of claim 2, wherein the examination object is a myocardal muscle, the cyclical movement is a heartbeat, or the examination object is the myocardal muscle and the cyclical movement is the heartbeat.

14. The method of claim 2, wherein the at least one tagging pattern comprises a plurality of tagging patterns,
wherein the generating of each tagging pattern of the plurality of tagging patterns is conducted at a tagging time instant within a cycle, and wherein at least two of the tagging time instants differ in respect of their position within their cycle.

15. A method for generating time-resolved images of an examination object, which executes a cyclical movement, with aid of a magnetic resonance device, the method comprising:
generating at least one tagging pattern with spatial magnetization differences by tagging pulses during a magnetization of the examination object;
acquiring magnetic resonance signals of the examination object during at least one cycle of the cyclical movement after the generating of the at least one tagging pattern, wherein at least one k-space is undersampled during the acquiring of the magnetic resonance signals;
determining a T1 time based on the acquired magnetic resonance signals, wherein the determining comprises modeling a T1 saturation repetition model function; and
generating time-resolved images based on the acquired magnetic resonance signals.

16. A magnetic resonance device for generating time-resolved images of an examination object, the magnetic resonance device comprising:
a radio frequency antenna unit configured to generate at least one tagging pattern with spatial magnetization differences by tagging pulses during a magnetization of the examination object and acquire magnetic resonance signals of the examination object, wherein the at least one tagging pattern comprises two consecutive magnetization patterns, and wherein the two consecutive tagging patterns are spaced apart temporally by at least two cycle lengths; and
a system control unit configured to perform a pulse sequence with an undersampling of a k-space for the acquisition of the magnetic resonance signals and to generate time-resolved images based on the magnetic resonance signals acquired by the radio frequency antenna unit.

17. The magnetic resonance device of claim 16, wherein the radio frequency antenna unit is configured to acquire the magnetic resonance signals of the examination object during at least one cycle of a cyclical movement after the generating of the at least one tagging pattern, wherein at least one k-space is undersampled during the acquiring of the magnetic resonance signals.

18. A computer program which comprises a program and is configured to be loaded into a memory of a programmable control unit of a magnetic resonance device, wherein the computer program is configured to cause the magnetic resonance device to at least perform:
generate at least one tagging pattern with spatial magnetization differences by tagging pulses during a magnetization of an examination object, wherein the at least one tagging pattern comprises two consecutive magnetization patterns, and wherein the two consecutive tagging patterns are spaced apart temporally by at least two cycle lengths;
acquire magnetic resonance signals of the examination object during at least one cycle of a cyclical movement after the generating of the at least one tagging pattern, wherein at least one k-space is undersampled during the acquiring of the magnetic resonance signals; and
generate time-resolved images based on the acquired magnetic resonance signals.

* * * * *